US012580581B2

(12) United States Patent
Zhu et al.

(10) Patent No.: US 12,580,581 B2
(45) Date of Patent: Mar. 17, 2026

(54) LOW PARASITIC CAPACITANCE ARCHITECTURE FOR SUCCESSIVE APPROXIMATION REGISTER ANALOG-TO-DIGITAL CONVERTERS

(71) Applicant: Avago Technologies International Sales Pte. Limited, Singapore (SG)

(72) Inventors: Hongjie Zhu, Austin, TX (US); Jie Fang, Austin, TX (US); Queennie Lim, San Jose, CA (US); Frank Singor, Austin, TX (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 157 days.

(21) Appl. No.: 18/498,311

(22) Filed: Oct. 31, 2023

(65) Prior Publication Data

US 2025/0141465 A1 May 1, 2025

(51) Int. Cl.
*H03M 1/46* (2006.01)
*H03M 1/00* (2006.01)

(52) U.S. Cl.
CPC .......... *H03M 1/468* (2013.01); *H03M 1/002* (2013.01); *H03M 1/462* (2013.01)

(58) Field of Classification Search
None
See application file for complete search history.

(56) References Cited

U.S. PATENT DOCUMENTS 5,166,687 A * 11/1992 Yung ................... H03M 1/0827
341/172

6,473,021 B1 * 10/2002 Somayajula ............ H03M 1/68
341/172
7,473,955 B1 * 1/2009 Heshami ............. H01L 23/5223
257/296
8,860,114 B2 * 10/2014 Yen ........................ H10D 1/043
257/306
10,687,004 B1 * 6/2020 Boemler .............. H04N 25/671
2005/0259379 A1 11/2005 Bely et al.
2006/0061935 A1 * 3/2006 Schultz ............... H01L 23/5223
361/306.1

(Continued)

FOREIGN PATENT DOCUMENTS

EP 3499567 A1 6/2019

OTHER PUBLICATIONS

Extended European Search Report, European Application No. 24202818.1 dated Mar. 17, 2025, 11 pages.

*Primary Examiner* — Muhammad Adnan
(74) *Attorney, Agent, or Firm* — King Intellectual Asset Management

(57) ABSTRACT

A unit capacitor for a switched-capacitor digital-to-analog converter is provided. An apparatus includes a first plate formed of a conductive material, wherein the first plate comprises one or more first fingers, wherein each respective first finger of the one or more first fingers has an elongated structure extending longitudinally in a first direction. The apparatus further includes a second plate formed of the conductive material, wherein the second plate comprises two or more second fingers, wherein each respective second finger of the two or more second fingers has an elongated structure extending in a second direction. Each first finger of the one or more first fingers is disposed between two adjacent second fingers of the two or more second fingers.

20 Claims, 9 Drawing Sheets

(56)     References Cited

U.S. PATENT DOCUMENTS

| | | | |
|---|---|---|---|
| 2007/0046519 A1* | 3/2007 | Hakkarainen | H10D 84/212 |
| | | | 341/172 |
| 2007/0278551 A1* | 12/2007 | Anthony | H01L 23/5223 |
| | | | 257/307 |
| 2008/0018608 A1* | 1/2008 | Serban | G06F 3/0447 |
| | | | 345/173 |
| 2013/0228894 A1* | 9/2013 | Yen | H10D 1/043 |
| | | | 257/532 |
| 2014/0367827 A1* | 12/2014 | Lee | H10D 84/212 |
| | | | 257/532 |
| 2019/0189350 A1* | 6/2019 | Kabir | H01G 4/232 |
| 2019/0341925 A1* | 11/2019 | Wang | H01L 23/528 |
| 2021/0304964 A1 | 9/2021 | Tien et al. | |
| 2023/0344438 A1* | 10/2023 | Harris | H03M 1/164 |

* cited by examiner

LOW PARASITIC CAPACITANCE ARCHITECTURE FOR SUCCESSIVE APPROXIMATION REGISTER ANALOG-TO-DIGITAL CONVERTERS

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for reducing parasitic capacitance in successive approximation register analog-to-digital converters.

BACKGROUND

Typical modern successive approximation register (SAR) analog-to-digital converters (ADC) utilize a top plate sampling architecture with a switched-capacitor (SC) (also referred to as a "switching-capacitor") digital-to-analog converter (DAC). A unit capacitor is the smallest individual capacitor in an SC DAC capacitor array. Low unit capacitor mismatch allows for high resolution, while low unit capacitor capacitance allows for high speed. Large full-scale voltage range in an SAR ADC allows for improved linearity and signal-to-noise ratio (SNR) performance.

Conventional metal-oxide-metal (MOM) capacitors, also known as metal finger capacitors, are used to implement capacitors in deep-submicron and advanced complementary metal-oxide semiconductor (CMOS) technologies. While the feature size of the metal layers of MOM capacitors continues to shrink, the parasitic capacitance on metal connection nodes become more significant as compared with the capacitance of the MOM capacitor.

Thus, a low parasitic capacitance architecture for SAR ADCs are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
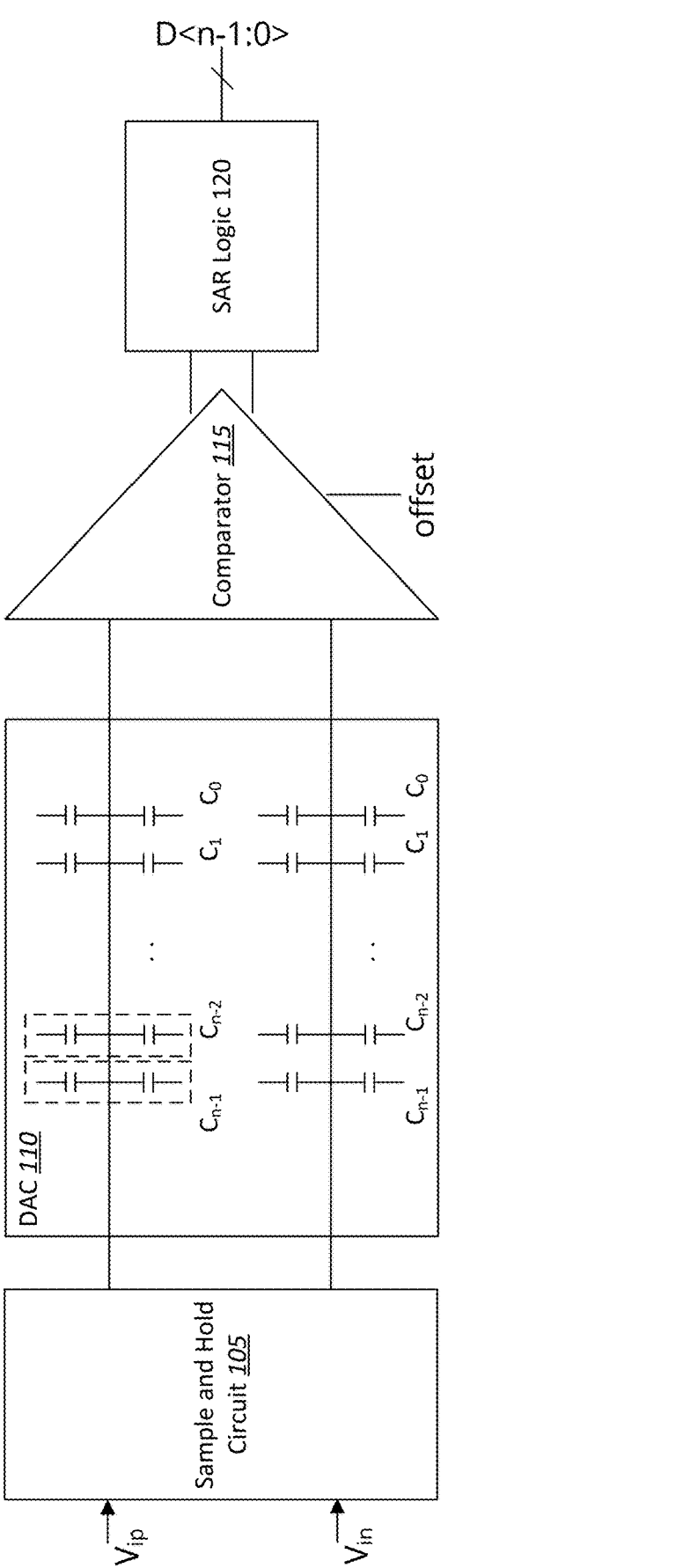
FIG. 1 is a schematic block diagram of an SAR ADC, in accordance with various embodiments.

Various embodiments set forth various configurations of capacitors and SC DACs in low parasitic capacitance SAR ADCs.

In some embodiments, an apparatus for a low parasitic capacitance unit capacitor is provided. The apparatus includes a first plate formed of a conductive material, wherein the first plate comprises one or more first fingers, wherein each respective first finger of the one or more first fingers has an elongated structure extending longitudinally in a first direction. The apparatus further includes a second plate formed of the conductive material, wherein the second plate comprises two or more second fingers, wherein each respective second finger of the two or more second fingers has an elongated structure extending in a second direction. Each first finger of the one or more first fingers is disposed between two adjacent second fingers of the two or more second fingers.

In further embodiments, a capacitor array for a switched-capacitor DAC architecture is provided. The capacitor array includes a first capacitor and a second capacitor. The first capacitor includes a first plate formed of a conductive material, wherein the first plate comprises one or more first fingers, wherein each respective first finger of the one or more first fingers has an elongated structure extending longitudinally in a first direction. The first capacitor further includes a second plate formed of the conductive material, wherein the second plate comprises two or more second fingers, wherein each respective second finger of the two or more second fingers has an elongated structure extending in a second direction. Each first finger of the one or more first fingers is disposed between two adjacent second fingers of the two or more second fingers. The capacitor array may further include a second capacitor coupled to the first, wherein the second capacitor includes at least part of one of the first plate or second plate.

In further embodiments, a system for a SAR ADC having a low-parasitic capacitance architecture is provided. The system includes a circuit configured to sample and generate an input signal, and a digital-to-analog converter configured to receive the input signal from the circuit and generate an output signal based, at least in part, on the input signal. The digital-to-analog converter includes a capacitor array, wherein the capacitor array comprises a plurality of unit capacitors. Each respective unit capacitor further includes a first capacitor. The first capacitor includes a first plate formed of a conductive material, wherein the first plate comprises one or more first fingers, wherein each respective first finger of the one or more first fingers has an elongated structure extending longitudinally in a first direction. The first capacitor further includes a second plate formed of the conductive material, wherein the second plate comprises two or more second fingers, wherein each respective second finger of the two or more second fingers has an elongated structure extending in a second direction. Each first finger of the one or more first fingers is disposed between two adjacent second fingers of the two or more second fingers. Each respective unit capacitor may further a second capacitor coupled to the first, wherein the second capacitor includes at least part of one of the first plate or second plate. The system further includes a comparator configured to compare the output signal to a reference voltage, and logic configured to generate a digital code based, at least in part, on an output of the comparator.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Likewise, when an element is referred to herein as being a "layer." it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having." as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B. and C. In instances where it is intended that a selection be of "at least one of each of A, B, and C." or alternatively, "at least one of A, at least one of B, and at least one of C." it is expressly described as such.

In conventional SC SAR ADCs utilizing a top plate sampling architecture, a larger full-scale voltage range allows for improved performance. However, the full-scale voltage range of a top plate sampling SAR ADC architecture is inversely correlated to the total parasitic capacitance on the top plate node of the SC DAC at a given reference voltage. Thus, minimizing parasitic capacitance on the top plate node of the SD DAC is important to achieving a large full-scale voltage range in a SAR ADC.

The proposed SAR ADC architecture set forth a unit capacitor that mitigates the undesirable parasitic capacitance on the top plate node of SC DAC in top plate sampling SAR ADC. By utilizing a MOM capacitor in which the top plate is shielded by structures of the bottom plate, parasitic capacitance may be mitigated while maintaining a low unit capacitor mismatch. A unit capacitor, as used herein, may refer to individual capacitors within an SC DAC capacitor array.

FIG. 1 is a schematic block diagram of an SAR ADC 100, in accordance with various embodiments. The ADC 100 includes a sample-and-hold circuit 105, DAC 110, comparator 115, and SAR logic 120. It should be noted that the various parts and components of the ADC 100 are schematically illustrated in FIG. 1, and that modifications to the various components and other arrangements of the ADC 100 may be possible and in accordance with the various embodiments.

In various examples, the ADC 100 may be a differential ADC. Accordingly, as depicted, the SAR ADC 100 may utilize both a positive input voltage (Vip) and negative input voltage (Vin) (collectively, the input signal (Vi)). In various embodiments, the sample and hold (S/H) circuit 105 may be a circuit configured to sample an input signal ($V_i$) and pass the signal forward, in this example, to the DAC 110. In various embodiments, the DAC 110 may be a SC DAC utilizing a top plate sampling architecture. The DAC 110 may comprise a plurality of unit capacitors, referred to as a "unit capacitor array." Each of the unit capacitors may include a top plate and a bottom plate. In some embodiments, each individual unit capacitor of the plurality of unit capacitors may include one or more metal-on-metal (MOM) capacitors, also referred to as "finger" or "interdigital" capacitors. For example, an individual unit capacitor of a unit capacitor array may be split into two individual MOM capacitors. As depicted, the DAC 110 may itself be a differential DAC, including a respective capacitor array for each of the input signals Vip and Vin. It is to be understood that in other embodiments, different architectures for the ADC may be utilized, such as a single-ended architecture utilizing only a single input signal (Vi), or pseudo-differential arrangement, and that embodiments are not limited to the fully differential arrangement depicted.

As will be described in greater detail below with respect to FIGS. 2A-4B Each individual MOM capacitor is configured such that the bottom plate shields the top plate of the unit capacitor on at least three sides. For example, in some embodiments, parasitic capacitance on the top plate may reduce the full-scale voltage range of the ADC 100, resulting in degraded performance. In contrast, the full-scale voltage range may be insensitive to parasitic capacitance on the bottom plate. Thus, by providing shielding of the top plate using the structures of the bottom plate, parasitic capacitance on the top plate may be reduced.

In some embodiments, shielding provided by the bottom plate has the effect of converting the undesirable parasitic capacitance between the top plate metal structures and silicon substrate, as well as between the top plate metal structures and adjacent metal wiring, into effective capacitance between the top plate and bottom plate of the unit capacitor.

As used herein, the substrate may refer to semiconductor substrate, such as, without limitation, bulk silicon, glass, ceramic, or other suitable substrate material. In various examples, the structures of a capacitor and/or capacitor array, including top plate and bottom plate of respective capacitor(s), may be deposited or otherwise disposed on the substrate. A top plate, as used herein, refers to the top plate of a capacitor, while the bottom plate may refer to the bottom plate of the capacitor. Capacitors may include two plates (e.g., a conductive structure formed of metal, conductive polysilicon, or other conductive material), separated by a dielectric material, and to which a charge may be applied to form capacitance. In some examples, the top plate may refer to the conductive structure of a capacitor on which a charge (Q) is applied. Conversely, the bottom plate may refer to the conductive structure of a capacitor on which a second charge (−Q) is applied, where Q may be a positive or negative charge. The top plate and bottom plate may include, without limitation, conductive plates or other planar structures, fingers, and other structures formed of a metallic or other conductive material, and separated by a dielectric material. Suitable materials may further include, without limitation, copper (Cu), gold (Au), silver (Ag), aluminum (Al), tantalum (Ta), conductive polysilicon.

Thus, in various examples, the top- and bottom plates of one or more capacitors and/or a capacitor array may be disposed on a top surface of the substrate (including any shielding structures, as will be described in greater detail below with respect to FIGS. 2A-4B).

A top plate sampling architecture refers to an arrangement in which the S/H circuit 105 is coupled to the top plate of the capacitor array of the DAC 100. The DAC 100 may, in various examples, generate an output signal based on a digital code. The output of the DAC 100 may be transmitted to the comparator 115, which may be configured to compare the output of the top plate of the DAC 100 with a reference voltage. The comparator then provides the output to SAR logic 120, which then generates a new digital code. In various examples, the DAC 100 include one or more capacitor arrays, each array having an n-number of unit capacitors (e.g., $C_0$-$C_{n-1}$), where n is an integer. In such examples, the SAR logic 120 may be configured to output an n-bit code based, at least in part, on the output of the comparator 115. Although a binary-weighted SC DAC array is described in this and other examples for purposes of explanation, it is to be understood that in other embodiments, the DAC 100 may include non-binary weighted SC DAC arrays, and that the DAC 100 is not limited to any one implementation of the SC DAC array.

Figure 2A:
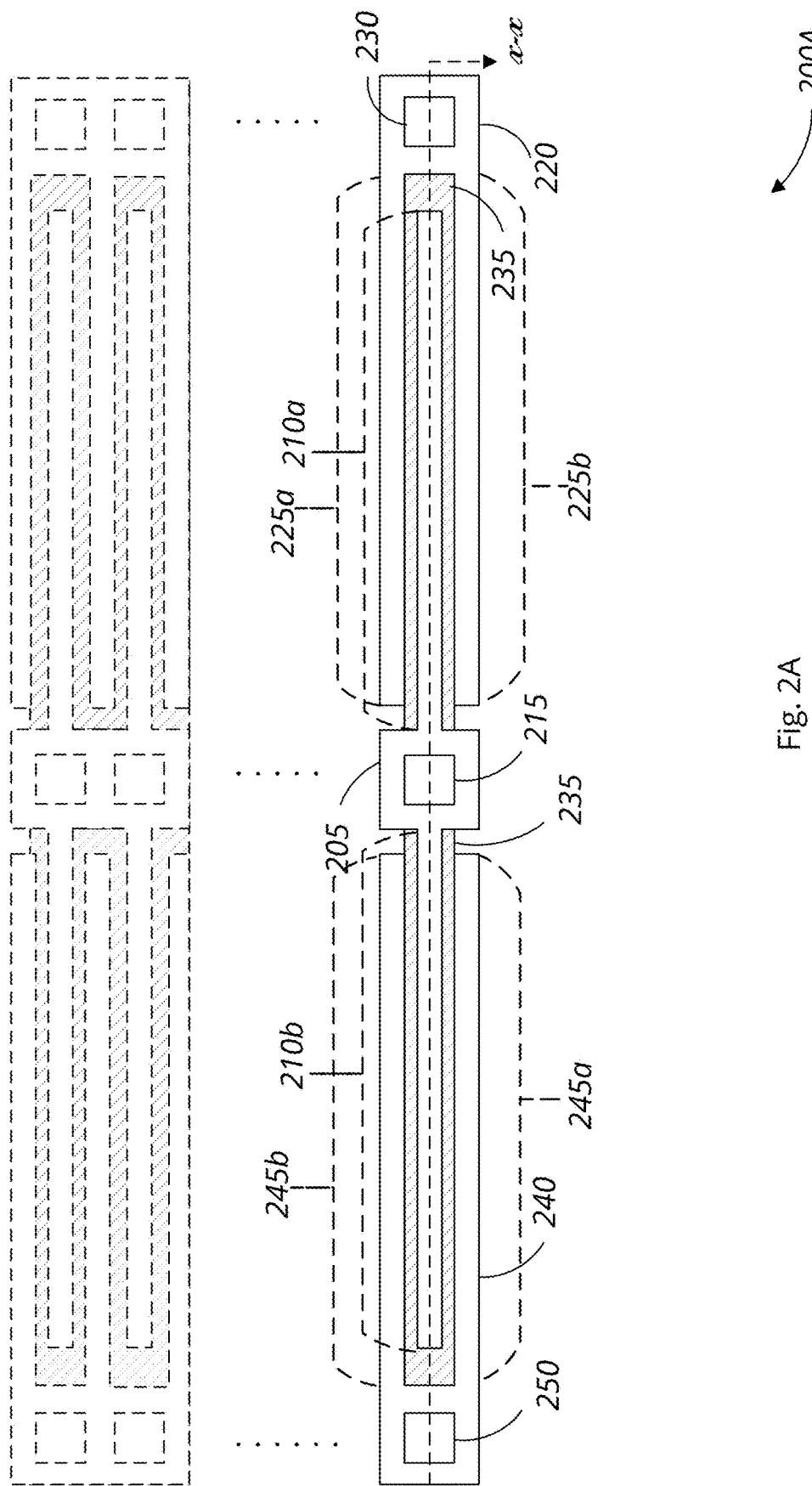
FIG. 2A is a schematic top view of a unit capacitor of an SC DAC, in accordance with various embodiments.

Various details of the arrangement of the unit capacitors are set forth below with respect to FIGS. 2A-4B. FIGS. 2A-2D illustrate alternative arrangements of a unit capacitor in a split configuration, in which a unit capacitor is split into two individual MOM capacitors, in which the top plate is shielded by the bottom plate. Specifically, FIG. 2A is a schematic top view of a unit capacitor 200A of an SC DAC, in accordance with various embodiments. The unit capacitor 200A may include a top plate 205, top plate via 215, a first top plate finger 210*a* and second top plate finger 210*b*, a first bottom plate 220, a first bottom plate finger 225*a* and second bottom plate finger 225*b*, first bottom plate via 230, bottom plate shielding structure 235, a second bottom plate 240 (having a third bottom plate finger 245*a* and fourth bottom plate finger 245*b*), and second bottom plate via 250. It should be noted that the various part and structures of the unit capacitor 200A are schematically illustrated in FIG. 2A, and that modifications to the various components and other arrangements of the capacitor 200A may be possible and in accordance with the various embodiments.

In various examples, each individual MOM capacitor of the unit capacitor 200A may include one or more interdigitated fingers. As used herein, a finger refers to an elongated conductive structure of a respective top plate 205 and/or bottom plate 220, 240. In various examples, a respective finger may be described as having a length that extends in a "longitudinal direction," and a width that extends in a "transverse direction."

As previously described, the unit capacitor may be split into a pair of MOM capacitors. Accordingly, the unit capacitor 200A may include two sets of interdigitated fingers (e.g., the fingers of a respective bottom plate 220, 240 may be interdigitated with respective fingers of the top plate 205). In further examples, the unit capacitor 200A may include more than two sets of interdigitated fingers. For example, the top plate 205 may include multiple fingers along the transverse direction, while the bottom plates 220, 240 similarly include multiple sets of fingers surrounding each of the respective fingers of the top plate 205. One example of this arrangement is optionally depicted in dashed lines.

For example, in various embodiments, the top plate 205 includes two sets of fingers: a first top plate finger 210*a* and second finger 210*b*. The first top plate finger 210*a* may be interdigitated with the fingers of the first bottom plate 220 (e.g., the first bottom plate finger 225*a* and second bottom plate finger 225*b*). Accordingly, in some examples, the first top plate finger 210*a* is surrounded on at least three sides by the first bottom plate, and at least two sides by the first and second bottom plate fingers 225*a*, 225*b*. In some further embodiments, the first top plate finger 210*a* may be surrounded on at least four sides by the first bottom plate 220 (e.g., by the first and second bottom plate fingers 225*a*, 225*b*) and by a shielding structure (e.g., bottom plate shielding structure 235) that extends along the bottom of the unit capacitor between the first bottom plate 220 and second bottom plate 240, and under the top plate 205 (as shown in FIGS. 2B-2D) and/or above the top plate 205 (as shown in FIG. 2C).

Similarly, in various embodiments, the second top plate finger 210*b* may be surrounded on at least three sides by the second bottom plate 240, including the respective fingers of the second bottom plate 240 (e.g., third and fourth bottom plate fingers 245*a*. 245*b*). In further examples, the second top plate finger 210*b* may further be shielded on a top and/or bottom via the second bottom plate. In this way, the top plate 205 and its respective fingers 210*a*, 210*b* may be shielded by the structures of the first and second bottom plate 220, including the respective fingers 225*a*, 225*b* of first bottom plate 220, and respective fingers 245*a*, 245*b* of the second-bottom plate 240, and bottom plate shielding structure 235.

The top plate 205 may further include top plate via 215. In various examples, a via may refer to a through-hole via (such as a plated through-hole (PTH) via, through-silicon via (TSV), etc.). The top plate via 215 may be configured to interconnect (e.g., electrically and/or physically couple) one or more layers of the top plate 205, as will be described in greater detail below. Similarly, the first bottom plate via 230 may be configured to interconnect one or more layers of the first bottom plate 220, and the second bottom plate via 250 may be configured to interconnect one or more layers of the second bottom plate 240.

Figure 2B:
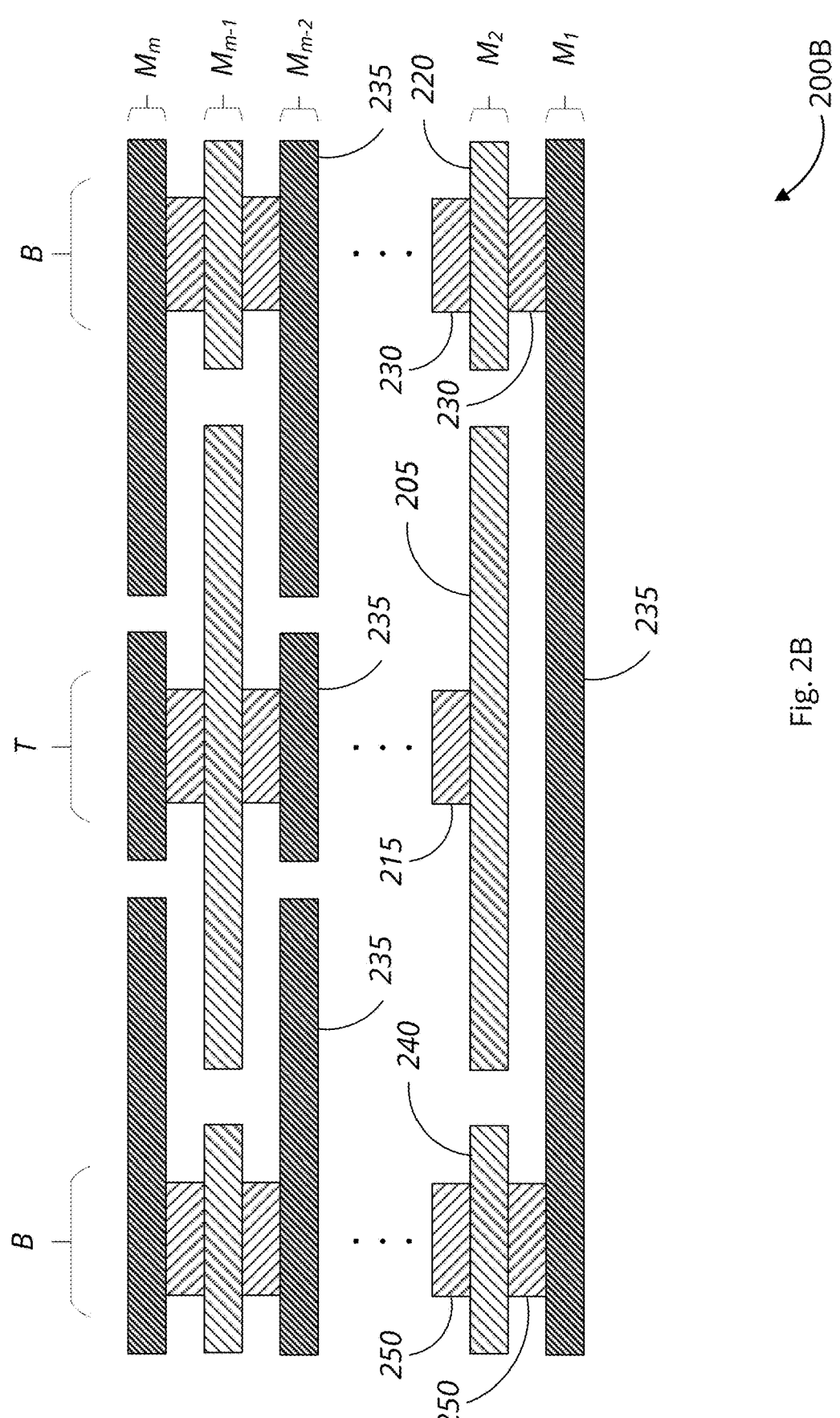
FIG. 2B is a schematic diagram of a cross-section of a first configuration of the unit capacitor of the SC DAC, in accordance with various embodiments.
Figure 2C:
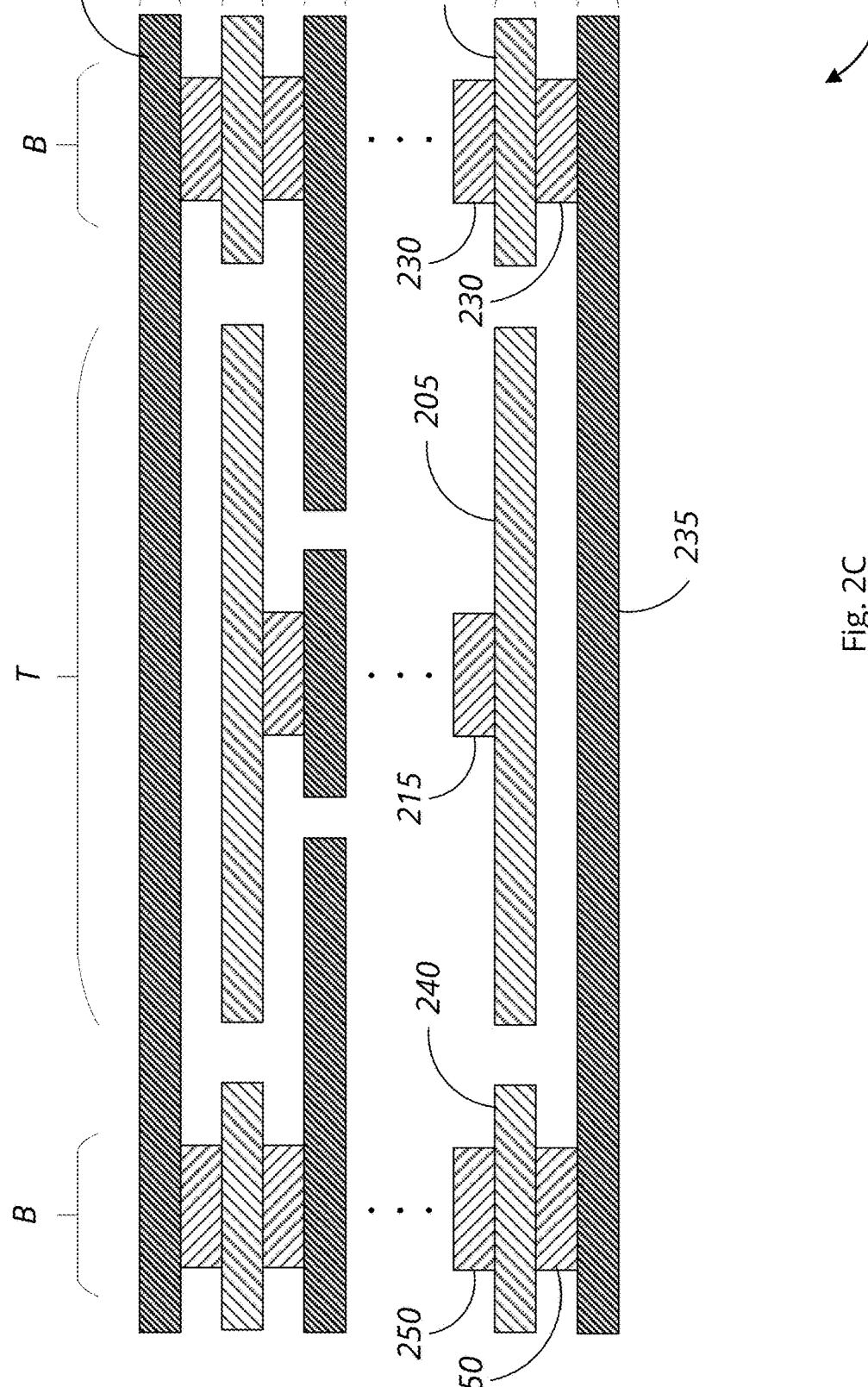
FIG. 2C is a schematic diagram of a cross-section of a second configuration of the unit capacitor of the SC DAC, in accordance with various embodiments.
Figure 2D:
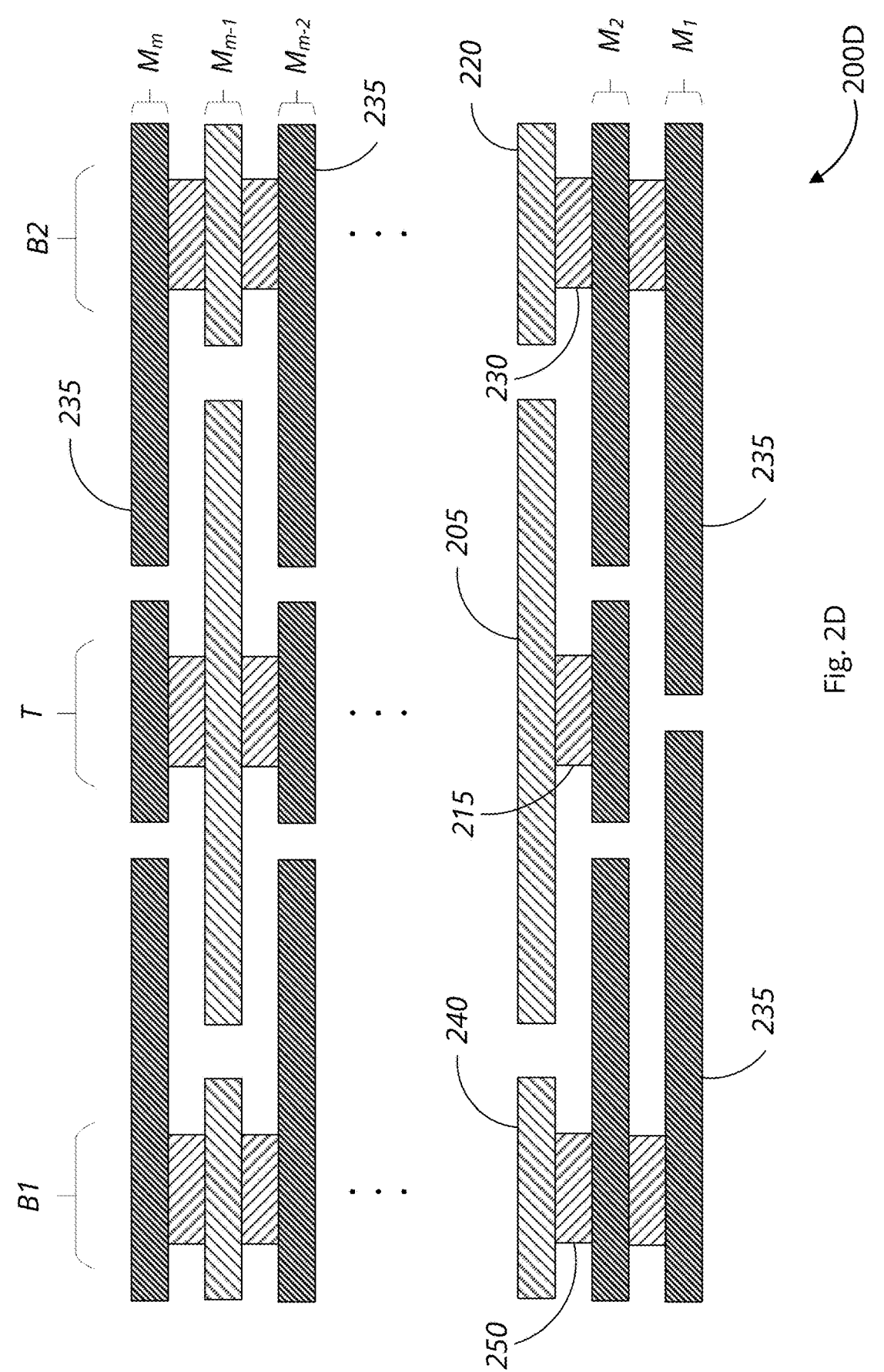
FIG. 2D is a schematic diagram of a cross-section of a third configuration of the unit capacitor of the SC DAC, in accordance with various embodiments.

FIGS. 2B-2D illustrate a cross-sectional view of various taken across line x-x. FIG. 2B is a schematic diagram of a cross-section of a first configuration of the unit capacitor 200B of the SC DAC, in accordance with various embodiments. FIG. 2C is a schematic diagram of a cross-section of a second configuration of the unit capacitor 200C of the SC DAC, in accordance with various embodiments. FIG. 2D is a schematic diagram of a cross-section of a third configuration 200D of the unit capacitor of the SC DAC, in accordance with various embodiments. It should be noted that the various parts and structures of the unit capacitor 200B-200D are schematically illustrated in FIGS. 2B-2D, and that modifications to the various structures and other arrangements of the unit capacitor 200B-200D may be possible and in accordance with the various embodiments.

With respect to FIGS. 2B-2D, the unit capacitor 200B-200D may include an m-number of layers, where m is an integer. For example, the unit capacitor 200B-200D may include an m number of layers, $M_1$-$M_m$. In a first configuration, the first layer $M_1$ of the unit capacitor 200B may be a bottom plate shielding structure 235 that is continuous, and couples the first bottom plate 220 and second bottom plate 240 together, for example, by respective vias 230, 250 which are coupled to the bottom plate shielding structure 235. In various examples, the bottom plate shielding structure 235 is formed of a conductive material, such as copper. In this way, a bottom side of the top plate 205 may be shielded, at least in part, by the bottom plates 220, 240, and specifically, the bottom plate shielding structure 235, which thereby forms part of the respective bottom plates 220, 240. Thus, in various examples, the bottom plate shielding structure 235 may be disposed under at least part of the top plate 205, and specific under at least part of top-plate fingers 210*a*, 210*b*.

FIG. 2C illustrates a second configuration of the unit capacitor 200C, in which a second bottom plate shielding structure 255 is disposed on (e.g., over) at least part of the top plate 205, along with a bottom plate shielding structure 235 that is disposed under at least part of the top plate 205. In some embodiments, like the bottom plate shielding structure 235, the second bottom plate shielding structure 255 may be coupled to both bottom plates 220, 240.

FIG. 2D illustrates a third configuration of the unit capacitor 200D, in which the bottom plate shielding structure 235 is split to create two half-unit capacitors. Specifically, the bottom plate shielding structure 235 does not couple the first bottom plate 220 to the second bottom plate 240. Accordingly, the first bottom plate 220 is labeled "B1," and second bottom plate 240 labeled "B2." Thus, while the bottom plate shielding structure 235 may be separated, each of the first and second bottom plates 220, 240 having a respective portion of the bottom plate shielding structure 235. Using two half-unit capacitors provides the SAR ADC 100 with an extra bit of resolution, while maintaining unit capacitor matching accuracy.

In each of the configurations 2B-2D, capacitance between top plate 205 and bottom plate 220, 240 are typically beneficial to the operation of the SC DAC, and effectively increases effective capacitance between the top plate 205 and bottom plates 220, 240. Parasitic capacitance (Cpar) between the top plate 205 and substrate, and between top plate 205 and any adjacent wiring or other signal lines, is reduced via shielding by the conductive structures of the bottom plate 220, 240 (including respective fingers 225*a*. 225*b*, 245*a*, 245*b*) and the bottom plate shielding structure 235, and the second bottom plate shielding structure 255.

Figure 3A:
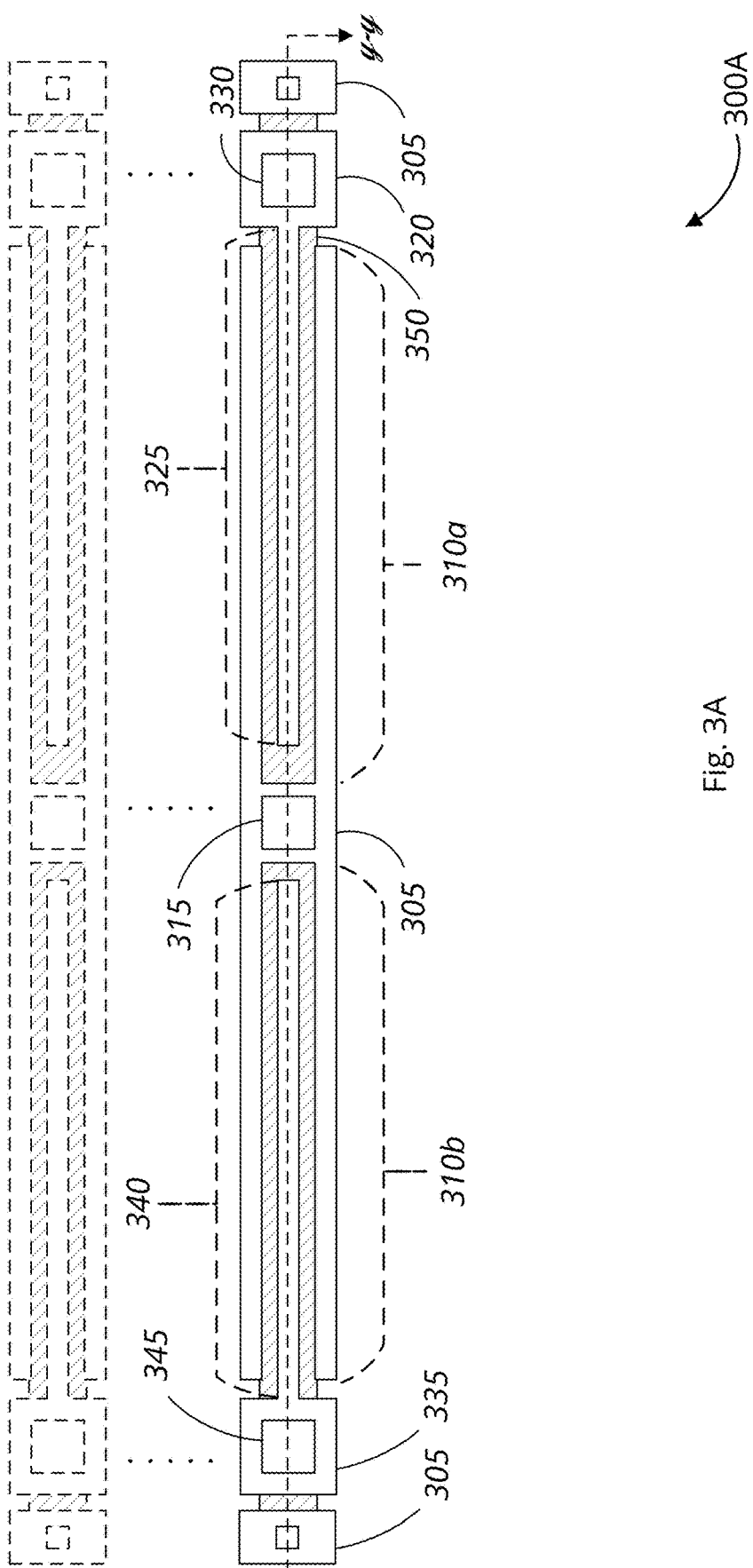
FIG. 3A is a schematic top view of a first alternative arrangement of a unit capacitor of an SC DAC, in accordance with various embodiments.

FIG. 3A is a schematic top view of a first alternative arrangement of a unit capacitor 300A of an SC DAC, in accordance with various embodiments. The unit capacitor 300A may include a bottom plate 305, first top plate 320, and second top plate 335. The bottom plate 305 may include a first set of bottom plate fingers 310*a* and a second set of bottom plate fingers 310*b*. The first top plate 320 may include a first top plate finger 325, and the second top plate 335 may include a second top plate finger 340. The bottom plate 305 further includes bottom plate via 315, while the first top plate 320 includes first top plate via 330 and second top plate 335 includes second top plate via 345. The bottom plate 305 further includes a bottom plate shielding structure 350. It should be noted that the various part and structures of the unit capacitor 300A are schematically illustrated in FIG. 3A, and that modifications to the various components and other arrangements of the capacitor 300A may be possible and in accordance with the various embodiments.

In contrast with the arrangement of unit capacitor 200A of FIG. 2A, the unit capacitor 300A utilizes a bottom plate 305 that is positioned between two top plates 320, 335, and where the bottom plate 305 includes two sets of bottom plate fingers 310*a*. 310*b* which extend on opposite sides of the bottom plate 305. In this arrangement, two top plates 320, 335 are utilized instead of the single, centrally positioned top plate 205 of FIG. 2A. The bottom plate 305 further shields the respective top plates 320, 335 on either side, opposite the respective fop plate fingers 325, 340. For example, the first top plate finger 325 may extend from a first side towards the bottom plate 305, and specifically the bottom plate via 315 disposed centrally between the first and second top plates 320, 335. The bottom plate 305 may, accordingly, further shield the first top plate 320 on a second side opposite the first side. Similarly, the second top plate finger 340 may extend from a second side towards the centrally disposed portion of the bottom plate 305. The bottom plate 305 may further be configured to shield the second top plate 335 on a first side opposite the second side. In some examples, this portion of the bottom plate 305 shielding the respective sides of the top plate 320, 335 may be referred to as the lateral portions of the bottom plate 305.

As previously described with respect to FIG. 2A, the unit capacitor 300A may include one or more sets of interdigitated fingers (e.g., where the top plate fingers 325, 340 are interdigitated with the bottom plate fingers 310a, 310b, respectively). In further examples, the unit capacitor 300A may include more than two sets of interdigitated fingers. For example, the bottom plate 305 and top plates 320, 335 may include multiple fingers along the transverse direction, as optionally depicted in dashed lines.

The first top plate finger 325 may be surrounded on at least three sides by the bottom plate 305 and the first set of bottom plate fingers 310a. Similarly, the second top plate 335 also includes a second top plate finger 340, which is surrounded on at least three sides by the bottom plate 305 and the second set of bottom plate fingers 310b. Thus, the first top plate 320 and second top plate 335 are shielded on at least four sides by the structures bottom plate 305, including the bottom plate shielding structure 350.

In various examples, each individual MOM capacitor of the unit capacitor 300A includes one or more interdigitated fingers. As previously described, the unit capacitor may be split into a pair of MOM capacitors. Accordingly, the unit capacitor 300A may include two sets of interdigitated fingers (e.g., the fingers of a respective top plate 320, 335 may be interdigitated with respective fingers of the bottom plate 305).

As previously described, the first and second top plate vias 330, 345 may be configured to interconnect (e.g., couple electrically and/or physically) one or more layers of the respective top plate 320, 335 structures. For example, the first top plate via 330 may be configured to interconnect the one or more layers of the first top plate 320, and the second top plate via 345 may be configured to interconnect the one or more layers of the second top plate 335. Similarly, the bottom plate via 315 may be configured to interconnect one or more layers of the bottom plate 305. In some further embodiments, the lateral portions of the bottom plate 305 may also respectively include vias.

Figure 3B:
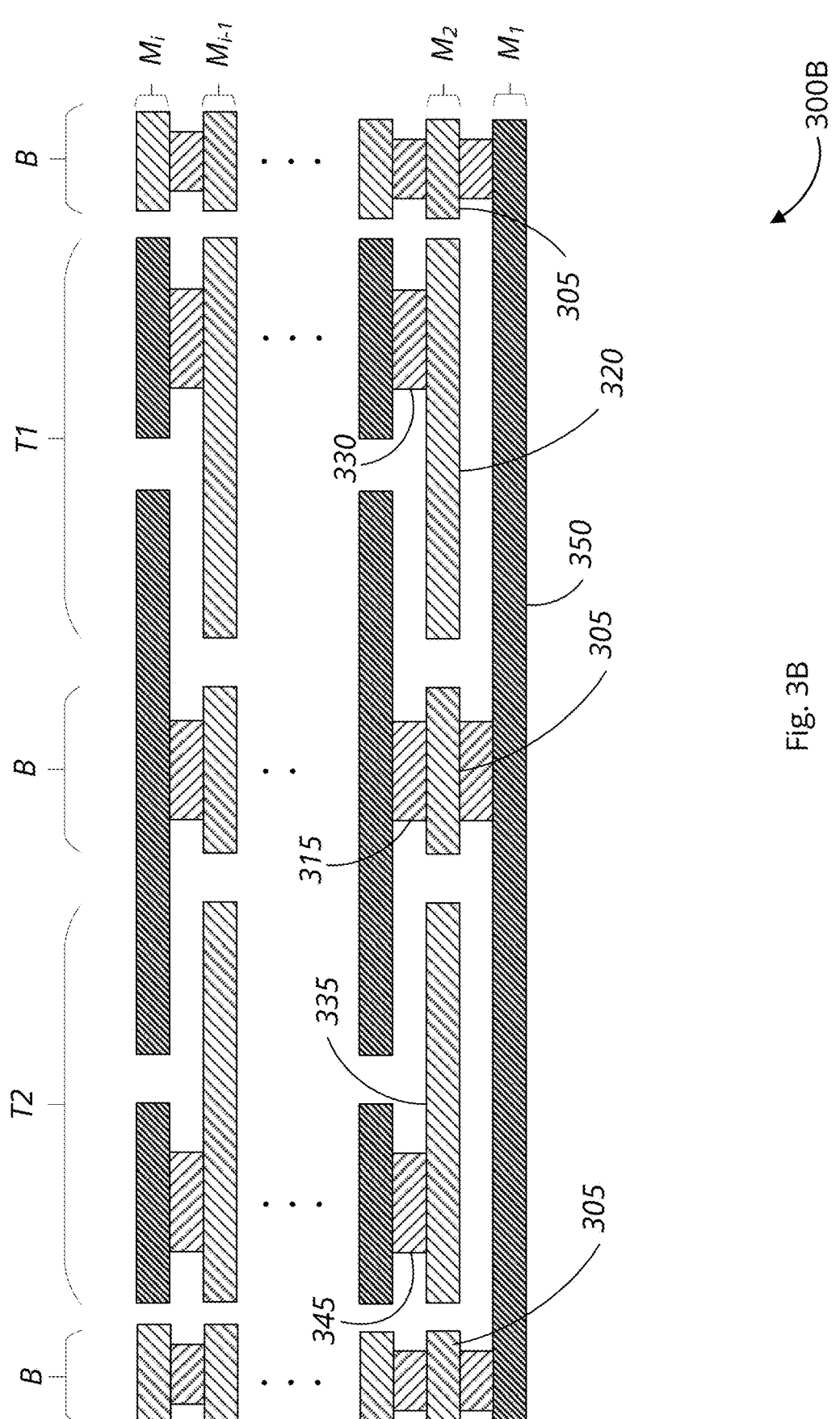
FIG. 3B is a schematic diagram of a cross-section of the first alternative arrangement of a unit capacitor of an SC DAC, in accordance with various embodiments.

FIG. 3B is a schematic diagram of a cross-section of the first alternative arrangement of a unit capacitor 300B, in accordance with various embodiments. Specifically, FIG. 3B depicts a cross-section taken across line y-y of the unit capacitor 300A. With respect to FIG. 3B, the unit capacitor 300B includes an i-number of layers, where i is an integer. For example, the unit capacitor 300B includes an i number of layers, $M_1$-$M_i$. In a first configuration, the first layer $M_1$ of the unit capacitor 300B may be a bottom plate shielding structure 350. In contrast with the previous arrangements of the unit capacitor 200A-200D, the first and second top plates 320, 335 of the unit capacitor 300A are not coupled together, with the first top plate 320 labeled T1 and second top plate 335 labeled T2. In this way, a bottom side of the first and second top plates 320, 335 may be shielded by the bottom plate shielding structure 350.

Figure 4A:
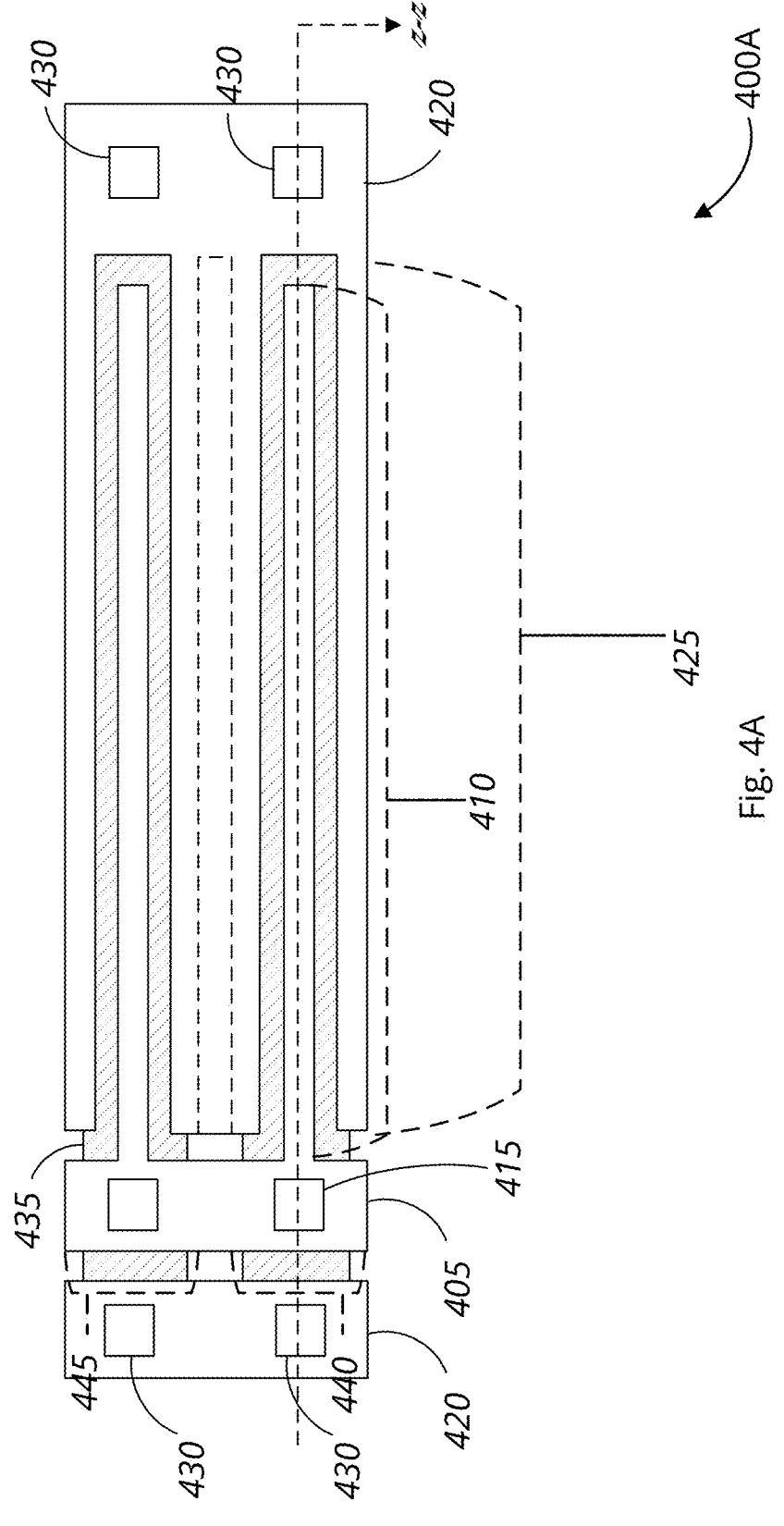
FIG. 4A is a schematic top view of a second alternative arrangement of a unit capacitor of an SC DAC, in accordance with various embodiments.

FIG. 4A is a schematic top view of a second alternative arrangement of a unit capacitor of an SC DAC, in accordance with various embodiments. The unit capacitor 400A may include a top plate 405, which includes a first top plate portion 440 and second top plate portion 445, respective top plate fingers 410, and respective top plate vias 415. The unit capacitor 400A further includes a bottom plate 420, with respective sets of bottom plate fingers 425, and respective bottom plate vias 430. The bottom plate 420 may further include one or more bottom plate shielding structures 435 It should be noted that the various part and structures of the unit capacitor 400A are schematically illustrated in FIG. 4A, and that modifications to the various components and other arrangements of the capacitor 400A may be possible and in accordance with the various embodiments.

In various embodiments, the top plate 405 may include two top plate fingers 410. The bottom plate 420 may include two sets of bottom plate fingers 425, each set of bottom plate fingers 425 being interdigitated with a respective top plate finger 410. As will be noted, each top plate finger may be surrounded by a respective set of two bottom plate fingers 425. Thus, each top plate finger 410 may be shielded by two respective bottom plate fingers 425. Moreover, each top plate finger 410 may be shielded by a respective bottom plate shielding structure 435.

In contrast with the arrangements of unit capacitors 200A, 300A of FIGS. 2A & 3A, the unit capacitor 400A utilizes a top plate 405 having two top plate fingers 410 extending in the same direction (on a first side of the top plate 405). The top plate 405 is further shielded by a lateral portion of the bottom plate 420 on a second side opposite the first side. Moreover, a single bottom plate 420 is used, with a respective set of bottom plate fingers 425 for each top plate finger 410. In this arrangement, one top plate 405 and one bottom plate 420 may be utilized.

As previously described, the unit capacitor 400A may include one or more sets of interdigitated fingers (e.g., where the top plate fingers 410 are interdigitated with respective sets of the bottom plate fingers 425, respectively). Accordingly, the top plate fingers 410 may, respectively, be surrounded on at least three sides by the structures of the bottom plate 420.

In various examples, each individual MOM capacitor of the unit capacitor 400A includes one or more interdigitated fingers. As previously described, the unit capacitor 400A may be split into a pair of MOM capacitors. Accordingly, the unit capacitor 400A may include two sets of interdigitated fingers (e.g., the each top plate finger 410 may be interdigitated with a respective set of bottom plate fingers 425).

As described, in some embodiments, the top plate 405 may be shielded on at least three sides by the bottom plate 420. In some further embodiments, the top plate 405 may be shielded on at least four sides by the bottom plate 420 (e.g., on a bottom side, between the top plate and the substrate, via the bottom plate shielding structure 435).

Figure 4B:
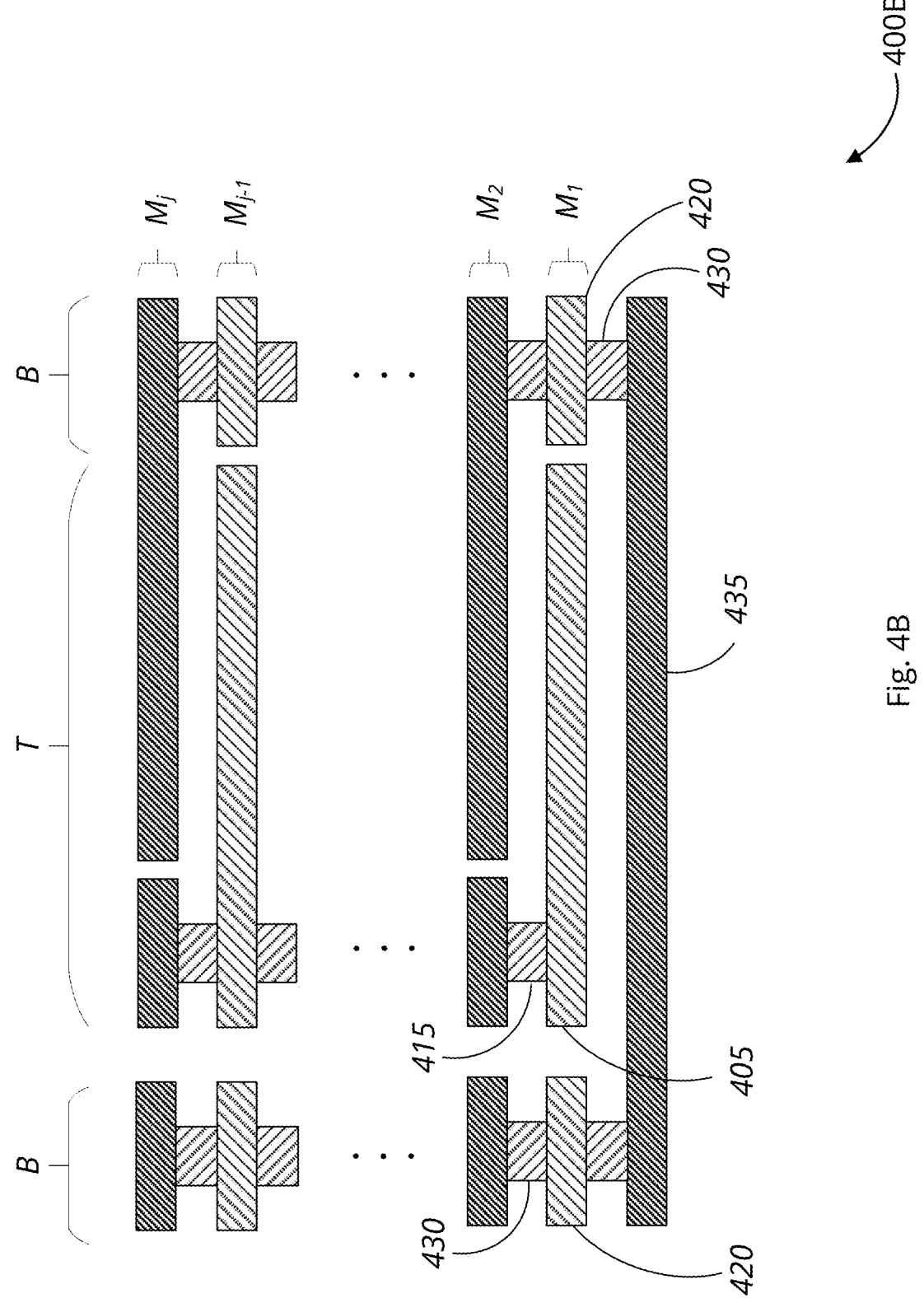
FIG. 4B is a schematic diagram of a cross-section of a third alternative arrangement of a unit capacitor of an SC DAC, in accordance with various embodiments.

FIG. 4B is a schematic diagram of a cross-section of the second alternative arrangement of a unit capacitor 400B of an SC DAC, in accordance with various embodiments. Specifically, FIG. 4B depicts a cross-section taken across line z-z of the unit capacitor 400A. With respect to FIG. 4B, the unit capacitor 400B includes a j-number of layers, where j is an integer. For example, the unit capacitor 400B includes a j-number of layers, $M_1$-$M_j$. In a first configuration, the first layer $M_1$ of the unit capacitor 400B may be a bottom plate shielding structure 435. In some further alternative embodiments, in contrast with the previous arrangements of the unit capacitor 200A-200D, 300A-300B, 400A, the unit cap 400B may utilize different layers of the unit capacitor (e.g., $M_1$ and $M_{j-1}$, where j=4) to form respective individual MOM capacitors. In other words, $M_{j-1}$ may form a first individual MOM capacitor of the unit capacitor 400B, and $M_j$ may form a second individual MOM capacitor of the unit capacitor 400B.

While some features and aspects have been described with respect to the embodiments, one skilled in the art will recognize that numerous modifications are possible. For example, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:
a first capacitor, wherein the first capacitor comprises:
a first plate formed of a conductive material, wherein the first plate comprises one or more first fingers, wherein each respective first finger of the one or more first fingers has an elongated structure extending longitudinally in a first direction;
a second plate formed of the conductive material, wherein the second plate comprises two or more second fingers, wherein each respective second finger of the two or more second fingers has an elongated structure extending in a second direction, and an integral shielding structure disposed at least partially under at least part of the first plate;
wherein each first finger of the one or more first fingers is disposed between two adjacent second fingers of the two or more second fingers.

2. The apparatus of claim 1, wherein the shielding structure is elongated and has a length extending in the second direction.

3. The apparatus of claim 2, wherein the third plate comprises a second shielding structure separate from the first, wherein the second shielding structure is disposed under at least part of a respective third finger of the one or more third fingers of the first plate.

4. The apparatus of claim 1 further comprising a second capacitor, wherein the second capacitor comprises:
at least part of the first plate, the first plate further comprising one or more third fingers, wherein each respective third finger of the one or more third fingers has an elongated structure extending longitudinally in one of the first or second direction; and
a third plate formed of the conductive material, wherein the third plate comprises two or more fourth fingers, wherein each respective fourth finger of the two or more fourth fingers has an elongated structure extending in a direction opposite the one or more third fingers,
wherein each third finger of the one or more third fingers is disposed between two adjacent fourth fingers of the two or more fourth fingers.

5. The apparatus of claim 4, wherein the shielding structure extends in the second direction, and wherein the third plate is coupled to the shielding structure.

6. The apparatus of claim 1, wherein the shielding structure is split to create two half-unit capacitors.

7. The apparatus of claim 1 further comprising a second capacitor, wherein the second capacitor comprises:
at least part of the second plate, the second plate further comprising two or more third fingers, wherein each respective third finger of the two or more third fingers has an elongated structure extending longitudinally in the first direction; and
a third plate formed of the conductive material, wherein the third plate comprises one or more fourth fingers, wherein each respective fourth finger of the one or more fourth fingers has an elongated structure extending in the second direction,
wherein each fourth finger of the one or more fourth fingers is disposed between two adjacent third fingers of the two or more third fingers.

8. The apparatus of claim 7, wherein the shielding structure is disposed under at least part of the third plate.

9. The apparatus of claim 1, further comprising a second capacitor, wherein the second capacitor comprises:
at least part of the second plate, wherein the second plate further comprises two or more fourth fingers, wherein the second plate comprises a first layer and a second layer, wherein the two or more second fingers form at least part of the first layer, and wherein the two or more fourth fingers form at least part of the second layer; and
a third plate disposed under the first plate, wherein the third plate is coupled to the first plate, and wherein the third plate further comprises one or more third fingers,
wherein the one or more first fingers form at least part of a first layer, and wherein the one or more third fingers form at least part of the second layer,
wherein each third finger of the one or more third fingers is disposed between two adjacent fourth fingers of the two or more fourth fingers.

10. The apparatus of claim 1, wherein the first plate comprises at least two first fingers, and the second plate comprises at least three second fingers, wherein each respective first finger of the at least two first fingers is disposed between two adjacent second fingers.

11. A capacitor array comprising:

a plurality of unit capacitors, wherein each respective unit capacitor further comprises:

a first capacitor, wherein the first capacitor comprises:

a first plate formed of a conductive material, wherein the first plate comprises one or more first fingers, wherein each respective first finger of the one or more first fingers has an elongated structure extending longitudinally in a first direction;

a second plate formed of the conductive material, wherein the second plate comprises two or more second fingers, wherein each respective second finger of the two or more second fingers has an elongated structure extending in a second direction, and an integral shielding structure disposed at least partially under at least part of the first plate;

wherein each first finger of the one or more first fingers is disposed between two adjacent second fingers of the two or more second fingers; and a second capacitor coupled to the first, wherein the second capacitor includes at least part of one of the first plate or second plate.

12. The capacitor array of claim 11, wherein the shielding structure is elongated and has a length extending in the second direction.

13. The capacitor array of claim 11, wherein the second capacitor comprises:

at least part of the first plate, the first plate further comprising one or more third fingers, wherein each respective third finger of the one or more third fingers has an elongated structure extending longitudinally in one of the first or second direction; and a third plate formed of the conductive material, wherein the third plate comprises two or more fourth fingers, wherein each respective fourth finger of the two or more fourth fingers has an elongated structure extending in a direction opposite the one or more third fingers, wherein each third finger of the one or more third fingers is disposed between two adjacent fourth fingers of the two or more fourth fingers.

14. The capacitor array of claim 13, wherein the shielding structure is elongated and has a length extending in the second direction, and wherein the third plate is coupled to the shielding structure.

15. The capacitor array of claim 13, wherein the third plate comprises a second shielding structure separate from the first, wherein the second shielding structure is disposed under at least part of a respective third finger of the one or more third fingers of the first plate.

16. A system comprising:

a circuit configured to sample and generate an input signal;

a digital-to-analog converter configured to receive the input signal from the circuit and generate an output signal based, at least in part, on the input signal, wherein the digital-to-analog converter further comprises:

a capacitor array, wherein the capacitor array comprises a plurality of unit capacitors, wherein each respective unit capacitor further comprises:

a first capacitor, wherein the first capacitor comprises:

a first plate formed of a conductive material, wherein the first plate comprises one or more first fingers, wherein each respective first finger of the one or more first fingers has an elongated structure extending longitudinally in a first direction; and a second plate formed of the conductive material, wherein the second plate comprises two or more second fingers, wherein each respective second finger of the two or more second fingers has an elongated structure extending in a second direction, and an integral shielding structure disposed at least partially under at least part of the first plate;

wherein each first finger of the one or more first fingers is disposed between two adjacent second fingers of the two or more second fingers; and a second capacitor coupled to the first, wherein the second capacitor includes at least part of one of the first plate or second plate; and a comparator configured to compare the output signal to a reference voltage; and logic configured to generate a digital code based, at least in part, on an output of the comparator.

17. The system of claim 16, wherein the shielding structure is elongated and has a length extending in the second direction.

18. The system of claim 16, wherein the second capacitor comprises:

at least part of the first plate, the first plate further comprising one or more third fingers, wherein each respective third finger of the one or more third fingers has an elongated structure extending longitudinally in one of the first or second direction; and a third plate formed of the conductive material, wherein the third plate comprises two or more fourth fingers, wherein each respective fourth finger of the two or more fourth fingers has an elongated structure extending in a direction opposite the one or more third fingers, wherein each third finger of the one or more third fingers is disposed between two adjacent fourth fingers of the two or more fourth fingers.

19. The system of claim 16, wherein the second capacitor comprises:

at least part of the second plate, the second plate further comprising two or more third fingers, wherein each respective third finger of the two or more third fingers has an elongated structure extending longitudinally in the first direction; and a third plate formed of the conductive material, wherein the third plate comprises one or more fourth fingers, wherein each respective fourth finger of the one or more fourth fingers has an elongated structure extending in the second direction, wherein each fourth finger of the one or more fourth fingers is disposed between two adjacent third fingers of the two or more third fingers.

20. The system of claim 16, wherein the second capacitor comprises:

at least part of the second plate, wherein the second plate further comprises two or more fourth fingers, wherein the second plate comprises a first layer and a second layer, wherein the two or more second fingers form at least part of the first layer, and wherein the two or more fourth fingers form at least part of the second layer; and a third plate disposed under the first plate, wherein the third plate is coupled to the first plate, and wherein the third plate further comprises one or more third fingers, wherein the one or more first fingers form at least part of a first layer, and wherein the one or more third fingers form at least part of the second layer, wherein each third finger of the one or more third fingers is disposed between two adjacent fourth fingers of the two or more fourth fingers.

* * * * *